United States Patent [19]

Kawasumi

[11] Patent Number: 4,714,645
[45] Date of Patent: Dec. 22, 1987

[54] ELECTRONIC PARTS AND PROCESS FOR THE MANUFACTURE OF THE SAME

[75] Inventor: Shinroku Kawasumi, Kamakura, Japan

[73] Assignees: Mitsubishi Mining & Cement Co., Ltd., Tokyo; Kawasumi Laboratories, Inc., Kamakura, both of Japan

[21] Appl. No.: 883,290

[22] Filed: Jul. 7, 1986

Related U.S. Application Data

[63] Continuation of Ser. No. 693,827, Jan. 23, 1985, abandoned, which is a continuation of Ser. No. 433,956, Oct. 13, 1982, abandoned.

[30] Foreign Application Priority Data

Oct. 20, 1981 [JP] Japan .................................. 56-166335

[51] Int. Cl.[4] .......................... B32B 5/16; B05D 3/02
[52] U.S. Cl. .................................... 428/209; 106/1.14; 106/1.18; 106/1.19; 427/376.2; 428/148; 428/210; 428/325; 428/328; 428/403; 428/404; 428/469; 428/472; 428/688; 428/704; 428/454
[58] Field of Search ............. 428/148, 328, 404, 472, 428/403, 325, 209, 210, 469, 704, 688, 454; 427/376.2; 106/1.14, 1.18, 1.19

[56] References Cited

U.S. PATENT DOCUMENTS

| | | | |
|---|---|---|---|
| 2,788,460 | 4/1957 | De Santis et al. | 428/472 X |
| 2,833,676 | 5/1958 | Heibel et al. | 428/472 |
| 2,993,815 | 7/1961 | Treptow | 428/472 X |
| 3,343,985 | 9/1967 | Vickery | 428/404 X |
| 3,708,728 | 1/1973 | Sterling et al. | 428/403 X |
| 3,873,351 | 3/1975 | Ueda et al. | 427/369 |
| 3,874,899 | 4/1975 | Miszenti et al. | 427/369 |
| 4,053,864 | 10/1977 | Rodrigruez et al. | 428/328 X |
| 4,098,188 | 7/1978 | Stroszynski | 428/328 X |
| 4,187,328 | 2/1980 | Jumel | 428/403 X |
| 4,251,275 | 2/1981 | Deffeyis et al. | 106/1.19 X |
| 4,309,458 | 1/1982 | Kawasumi et al. | 428/403 X |
| 4,353,951 | 10/1982 | Yukitoshi et al. | 428/328 X |
| 4,419,279 | 12/1983 | Abrams | 428/403 X |
| 4,485,153 | 11/1984 | Janikowski et al. | 106/1.19 X |
| 4,496,475 | 1/1985 | Abrams | 428/404 X |

Primary Examiner—Ellis P. Robinson
Assistant Examiner—James B. Monroe
Attorney, Agent, or Firm—Frishauf, Holtz, Goodman & Woodward

[57] ABSTRACT

Electronic parts comprising ceramic substrate and electrode layer provided onto the substrate in which a micro-granular ceramic powder is dispersed substantially only inside of the electrode layer. A process for the manufacture of the same is also disclosed.

17 Claims, No Drawings

ELECTRONIC PARTS AND PROCESS FOR THE MANUFACTURE OF THE SAME

This application is a continuation, of application Ser. No. 693,827, filed Jan. 23, 1985, (now abandoned), which is a continuation of Ser. No. 433,956, filed Oct. 13, 1982 (now abandoned).

This invention relates to electronic parts comprising electrode layer, and a process for the manufacture of the same. More particularly, this invention relates to electronic parts comprising a ceramic substrate and an electrode layer provided on the substrate.

Various types of electronic parts comprising a unit structure consisting essentially of a substrate and an electrode layer provided onto the substrate have been already known. As an example of such a type of electronic parts, ceramic condenser, thermistor, varistor, various kinds of resistors, CR composite parts, IC substrate and electroconductive pattern for printed wiring can be mentioned.

As electroconductive material for the electrode layer of above electronic parts, silver, gold, palladium and platinum or alloys thereof have been most generally used. Owing to the high electroconductivity of these precious metals, they are most suitable for the material of the electrode. However, the high price of each precious metals is an obstacle to reduction of the manufacturing cost of electronic parts.

For this reason, trials for replacing the precious metal with the non-precious metal or with an electroconductive paste consisting of precious metal-coated powder obtained by coating micro-granular non-precious metal with precious metal have been studied, for reducing the amount of precious metal.

The former trial comprising use of non-precious metals such as copper and nickel as a material of electrode instead of the precious metal has been employed in practice in the manufacture of ceramic condenser and IC substrate. However, it is required that these non-precious metals should be fired onto a substrate in nitrogen atmosphere for the purpose of prevention of oxidation. For this purpose, a special kiln operable under controlled atmosphere is required.

Further, in the manufacture of a laminated condenser which has been widely used recently and a laminated varistor, laminated coil and multilayer IC package which are manufactured in the same manner as that of the laminated condenser, the material of electrode is required to be stable at high temperature because the materials of electrodes and substrates for the condenser, varistor and so on are fired simultaneously. Generally, non-precious metal is unstable at a high temperature except when it is placed in the specific atmosphere. Accordingly, expensive precious metals such as platinum, palladium, silver and alloys thereof have been usually used as a material of the electrode (electroconductive metal material) for electronic parts which are manufactured by simultaneously firing the material for electrode and the substrate.

Moreover, when the powder of non-precious metal in the form of electroconductive paste and the ceramic substrate are fired simultaneously after the paste is coated on the substrate, various structural defects are caused due to the difference of expansion and shrinkage curves between the metal and ceramics or the difference of sintering starting temperature between them, thereby deteriorating the electric property and mechanical strength of the produced electrode. The above problem also occurs when the powder of precious metal is used.

On the other hand, as mentioned above, the countermeasure in which the electroconductive paste consisting essentially of precious metal-coated powder obtained by coating a micro-granular non-precious metal with a precious metal is employed instead of a precious metal, thereby reducing the amount of a precious metal, has been studied and published. However, when the powder is coated by the known process such as chemical plating process, a precious metal-coated layer to be formed is contaminated with a part of component of a non-precious metal forming a core part. For this reason, the electrode layer manufactured by firing the electroconductive paste comprising granular powder having the contaminated coating layer placed on the substrate shows less conductivity than that of the precious metal used. Therefore, such electrode cannot be used for the use of electronic parts.

The primary object of this invention is to provide electronic parts comprising an electrode layer made of a reduced amount of electroconductive metal material without deteriorating the electric properties of the electroconductive metal material which is used as an electrode material.

Another object of this invention is to provide electronic parts comprising an electrode layer whose mechanical strength and resistance to solder are improved without deteriorating the electric properties of the electroconductive metal material which is used as an electrode material.

Further object of this invention is to provide a process for manufacturing an electronic parts comprising an electrode layer having the above advantageous characteristics.

Other objects and characteristics of this invention will be described in the following.

The objects of this invention as mentioned above can be achieved by this invention stated below.

First, this invention is to provide electronic parts comprising a ceramic substrate and an electrode layer formed on the substrate characterized in that micro-granular ceramic powder is dispersed substantially only inside of the electrode layer.

This invention is also to provide a process for manufacturing electronic parts comprising an electrode layer characterized in that an electroconductive paste comprising of micro-granular ceramic powder coated with an electroconductive metal material is fired onto a fired or unfired ceramic substrate.

This invention will be described in detail hereinafter.

The electronic parts according to this invention have a basic structure comprising a ceramic substrate and an electrode layer provided on the said substrate.

The principal component of the ceramic substrate is oxide ceramics such as silicon dioxide, zirconium oxide, aluminium oxide, titanium dioxide, ferric oxide, calcium oxide and barium titanate or non-oxide ceramics such as tungsten carbide, silicon carbide and titanium nitride. Some of these ceramic substrates have been already used or tried to use as electronic parts such as a ceramic condenser, thermistor, varistor, various kinds of resistors, CR composite parts, IC substrate, and electroconductive pattern for printed wiring, or as a substrate of electronic parts such as a laminated condenser, laminated varistor, laminated coil and multilayer IC package.

The electrode layer formed on the ceramic substrate is characterized in that the micro-granular ceramic powder is dispersed substantially only inside of the layer and the ceramic powder and/or component of ceramics does not substantially exist on the surface of the electrode layer. The expression "the ceramic powder and/or component of ceramics does not substantially exist on the surface of the electrode layer" means that the ceramic powder and component of ceramics are neither exposed nor present over the surface of the electrode layer in such an amount that distinctly changes the electric properties of the electrode layer.

Such electrode layers can be produced by firing onto the ceramic substrate the micro-granular ceramic powder with a coating layer consisting of the electroconductive metal material which is substantially not contaminated with the component of the ceramic powder, that is, high-purity-metal-coated powder (a powder coated with metallic layer of high purity).

It is very difficult to manufacture the high-purity-metal-coated powder by the known coating processes such as chemical plating process, while it is easily produced through reaction for producing a coating layer through gelling state as described as follows.

The following process is a representative process for carrying out the reaction for forming a coating layer through gelling state:

a process which comprises adding a reducing agent such as hydrazine under stirring to an aqueous suspension containing:
(A) a micro-granular ceramic powder being dispersed therein uniformly;
(B) a salt of electroconductive metal for forming the coating layer which is dispersed therein uniformly; and
(C) an ion of electroconductive metal for forming the coating layer which is dissolved therein, so as to form a coating layer of the electroconductive metal over the surface of the micro-granular ceramic powder, and recovering and drying the so coated powder.

Another process for carrying out the reaction for forming a coating layer through gelling state is as follows:

a process which comprises mixing:
an aqueous gelling solution containing an ion of the electroconductive metal and excessively saturated chelate compound of the electroconductive metal:
enough amount of hydrogen peroxide to reduce both ion of the electroconductive metal and chelate compound of the electroconductive metal to convert them into the electroconductive metal,
an aqueous dispersion containing micro-granular ceramic powder; and,
an alkali agent to dissolve gelling state of the aqueous gelling solution, upon which the electroconductive metal is deposited on the surface of micro-granular ceramic powder to form a coating layer of the electroconductive metal, and then recovering and drying the so coated powder.

A further process for carrying out the reaction for forming a coating layer through gelling state is as follows:

a process which comprises adding under stirring a reducing agent to a dispersion of a micro-granular ceramic powder in an aqueous gelling solution of pH 5-10 containing an electroconductive metal compound, a nonmetallic ammonium salt (e.g., ammonium chloride) and an aqueous ammonia, to dissolve the gelling state of the aqueous gelling solution, upon which the electroconductive metal is deposited on the ceramic powder to form a coating layer of the electroconductive metal, and recovering and drying the so coated powder.

The above-mentioned processes for producing a high purity metal-coated powder were already invented by the present invention in advance of this invention and the details of these processes are disclosed in the specifications of U.S. Pat. No. 4,450,162, and Japanese patent application Nos. 55(1980)51516, 55(1980)-116482, 56(1981)-133314 and 56(1981)-133315.

Examples of the electroconductive metal materials employable in this invention include precious metals such as platinum, gold, silver and palladium, and non-precious metals which can stably exist in the air such as molybdenum, nickel, cobalt, iron, copper, zinc, tin, antimony, tungsten, manganese, titanium, vanadium and chromium. These metals can be used individually or in the alloy.

Examples of the micro-granular ceramic powders employable in this invention include powders of the average diameter of not greater than 30 $\mu$m, of oxide ceramics such as silicon dioxide, zirconium oxide, aluminium oxide, titanium dioxide, ferric oxide, calcium oxide and barium titanate, and non-oxide ceramics containing at least two kinds of atoms such as tungsten carbide, silicon carbide and titanium nitride. It is preferable to use the micro-granular ceramic powder having the average diameter not greater than 5 $\mu$m in order to obtain an electrode layer having superior electric properties and mechanical strength. Depending upon the object, it is desirable to use the micro-granular ceramic powder having the average diameter not greater than 1 $\mu$m.

It is impossible to coat uniformly and purely with powder having extremely small diameter by the conventional chemical plating process, while the coating process through gelling state as mentioned above enables to form uniformly and purely coated layer.

In the electronic parts of this invention, the total amount of the micro-granular ceramic powder dispersed inside of the electrode layer is desired to be within the range of 90-10% by weight (more preferably 75-25% by weight). In case that the amount of the micro-granular ceramic powder dispersed inside of the electrode layer is within the above range, it is possible to obtain electrode layers having high stability in the properties required as an electrode layer such as electric properties, mechanical properties and resistance to solder.

The amount of the ceramic powder in the electrode layer can be varied by adjusting the amounts of substances to be introduced into the reaction mixture for the preparation of the precious metal-coated ceramic powder.

The electronic parts comprising an electrode layer can be manufactured by firing a high purity metal-coated powder prepared by the above process and in the form of a electroconductive paste onto a ceramic substrate.

The preparation of the electroconductive paste can by done by the conventional process for preparing the electroconductive paste using a pure electroconductive metal. More in detail, suitable additives and solvents are added to the high purity metal-coated powder to form an electroconductive paste.

An electrode can be formed on a ceramic substrate by coating the electroconductive paste on the ceramic substrate by a method of, for example, screen printing, and then firing it in a kiln. The firing process and conditions can be determined according to the process and conditions for firing the electroconductive paste consisting of the pure metal as same as that of forming the coating layer.

In this invention, it is advantageous if the material of the ceramic substrate and that of the micro-granular ceramic powder dispersed inside of the electrode layer are the same. In the conventional process of firing the electroconductive paste on the substrate, the electroconductive paste is generally coated on a substrate fired in advance and the firing of the paste is then carried out, because of the difference between the expansion coefficiency of the metal of the electroconductive paste and that of the material of the substrate. However, in this invention, the main component of the material of the ceramic substrate and the material of the micro-granular ceramic powder to be dispersed inside of the electrode layer can be chosen to be the same or similar material (for example, oxide ceramics is selected for both uses). Therefore, in case that the same or similar materials are chosen, the process wherein unfired ceramic substrate is directly coated with the electroconductive paste and then the firing of both of the substrate and paste can be done, that is, a simultaneous firing process, can be carried out.

As mentioned above, this invention resides in electronic parts comprising a ceramic substrate and an electrode layer provided onto the substrate. However, there can be required modification of electronic parts for working as various electronic parts, and this invention includes these various modifications. Namely, the electronic parts comprising a ceramic substrate and an electrode layer provided on the substrate can take various forms such as electronic parts provided with a lead wire, electronic parts comprising a plurality of electronic parts laminated one over another, and electronic parts comprising a plurality of coiled electronic parts. Examples of the products include electronic parts used in a ceramic condenser, thermistor, varistor, various kinds of resistors, CR composite parts, IC substrate and electronic pattern for printed wire, laminated condenser, laminated varistor, laminated coil, multilayer IC package and BL ceramic condenser.

According to the invention, it is possible to reduce the amount of the electroconductive metal material to be used as a material for the electrode of the electronic parts, without deteriorating the electric properties of the electroconductive metal material. Moreover, other properties of the electronic parts such as mechanical properties and resistance to solder can be improved.

For example, there is a phenomenon called delamination (layer separation) which is one of the structual properties giving a great influence to the mechanical strength of electronic parts. The delamination is a phenomenon in that a crack is caused between the electrode layer and the substrate by the difference of the expansion and shrinkage curve; the difference of the sintering starting temperature between the electroconductive material and the ceramic substrate; the combustion phenomenon caused by reaction between the electroconductive material, the bonding agent, the solvent and the ceramic substrate; and change in volume of the electrode caused by oxidation and reduction of the material of an electrode, and the delamination generally occurs in a process for manufacturing electronic parts by the simultaneous firing process. In case that the delamination occurs, properties of electronic parts, especially mechanical strength are remarkably deteriorated. Since the delamination hardly occurs in the electronic parts of this invention, these electronic parts show remarkably high mechanical strength.

Examples of this invention will be described as follows.

EXAMPLE 1

(I) Preparation of silver-coated barium titanate powder

An aqueous solution consisting of 10 g. of silver nitrate and 50 ml. of water and an aqueous solution consisting of 15 g. of disodium ethylenediaminetetraacetate (EDTA) and 200 ml. of water were mixed under stirring to obtain a gelling solution. Further, 50 ml. of water was introduced to the gelling solution in order to reduce the viscosity of the gelling state. To the gelling solution was then added 100 ml. of an aqueous solution of hydrogen peroxide (30% aqueous solution).

Independently, 6 g. of barium titanate powder (average diameter: 1.5 $\mu$m) was uniformly dispersed in 150 ml. of water to prepare a dispersion. The dispersion was introduced into the above-obtained gelling solution (in which hydrogen peroxide was added) and the mixture was sufficiently stirred. Into thus obtained gelling solution an aqueous solution of sodium hydroxide (NaOH 5 g./water 25 ml.) was added under vigorous stirring to dissolve the gelling state and to deposit silver metal on the surface of the barium titanate powder. Further, 150 ml. of an aqueous solution of hydrogen peroxide (30% aqueous solution) was added to this mixture to complete the reaction.

Thus obtained silver-coated barium titanate powder was taken out through processes of filtration, washing and drying. After drying, the powder showed light gray and the yield was 11.7 g. (theoretical yield: 12 g.) and the weight ratio of barium titanate / silver in the powder was 50/50.

(II) Electrode of ceramic condenser

A mixture of the following composition including the silver-coated barium titanate powder obtained in the above (I) was prepared.

| | |
|---|---|
| Silver-coated barium titanate powder | 10 g. |
| Lead borosilicate glass frit | 0.2 g. |
| Ethylcellulose | 1.0 g. |
| Ethylcellosolve | 2.5 g. |
| Butylcarbitol | 2.5 g. |

The mixture was sufficiently kneaded in a 3 roller type kneader to obtain an electroconductive paste.

The electroconductive paste was then printed by screen printing on both surfaces of a fired barium titanate element (substrate) for a ceramic condenser (diameter: 13.0 mm, thickness: 0.5 mm) and the printed element was then fired at a temperature of 800° C.

The electric properties, mechanical properties and the resistance to solder of this fired parts (element provided with the silver-coated ceramic electrode) were measured. The results are shown in Table 1.

For comparison, the same measurements were carried out on an element provided with a silver electrode manufactured by using the same amount of silver powder as the amount of the silver-coated ceramic powder and firing it in the same manner as above. The results are also shown in Table 1.

TABLE 1

| Property | Silver-coated ceramic electrode | Silver electrode |
|---|---|---|
| Electric property | | |
| $\epsilon_s$ | 6500 | 6420 |
| tan δ (%) | 1.5 | 1.6 |
| Tensile strength of lead wire | 2.5 kg. | 1.8 kg. |
| Solder loss | None | Loss at circumferential portion |
| Soldering | Wetting all over the surface | Same as left |

The measurements were carried out as follows.

The electrostatic capacity (C) and the dielectric dissipation factor (tan δ) were measured by using the model 4274A of YHP degital LCR meter at a temperature of 25° C. under the conditions that the measuring voltage was 1.0 $V_{rms}$ and the measuring frequency was 1.0 KHz.

Tensile strength of lead wire was measured in the Intesco Universal Material Testing Machine by soaking a fired electrode in melted solder (S-356, produced by Senju Metal Co., Ltd., Japan, Ag content: 3.5%), and providing the electrode with a solder-plated soft copper wire having a diameter of 0.5 mm (MLT-122, produced by Kyowa Densen Co., Ltd., Japan).

The solder loss and the soldering easiness were observed and examined through a stereoscopic microscope (magnifications: ×20) after soaking the electrode in solder (S-356) whose temperature was kept at 230° C.

EXAMPLE 2

(I) Preparation of silver-coated ferric oxide powder

Silver-coated ferric oxide powder was prepared in the same manner as in Example 1 except using 6 g. of ferric oxide powder (average diameter: 1.5 μm) in place of the barium titanate powder. The yield was 11.6 g. (theoretical yield: 12 g.) and the weight ratio of ferric oxide / silver in the powder was 50/50.

(II) Varistor electrode

A mixture of the following composition including silver-coated ferric oxide powder obtained in the above (I) was prepared.

| Silver-coated ferric oxide powder | 10 g. |
|---|---|
| Lead borosilicate glass frit | 0.2 g. |
| Ethylcellulose | 1.0 g. |
| Ethylcellosolve | 2.5 g. |
| Butylcarbitol | 2.5 g. |

The mixture was sufficiently kneaded in the 3 roller type kneader to obtain an electroconductive paste.

The electroconductive paste was then printed by screen printing on both surfaces of the fired varistor element (substrate, $Fe_2O_3$: 85 mole %, $La_2O_3$: 5 mole %, CaO: 10 mole %, diameter: 13.0 mm, thickness: 0.5 mm) and the printed element was then fired at a temperature of 800° C.

The electric properties, mechanical properties and the resistance to solder of the fired parts (element provided with the silver-coated ceramic powder electrode) were measured. The results are shown in Table 2.

For comparison, the same measurements was carried out on an element provide with silver electrode manufactured by using the same amount of silver powder as the amount of silver-coated ceramic powder and firing it in the same manner. The results are also shown in Table 2.

TABLE 2

| Property | Silver-coated ceramic electrode | Silver electrode |
|---|---|---|
| Electric property | | |
| α | 5 | 5 |
| $E_{10}$ | 12 V | 12 V |
| Tensile strength of lead wire | 2.6 kg. | 2.0 kg. |
| Solder loss | None | Loss at circumferential portion |
| Soldering | Wetting all over the surface | Same as left |

The voltage non-liner coefficient α and the terminal voltage at 10 mA current $E_{10}$ were measured at a temperature of 25° C. by means of Model 592C (manufactured by Mechatronics Corp.) and VOAC757 (manufactured by Iwatsu Electric Co., Ltd., Japan), respectively.

The tensile strength of lead wire, solder loss and the soldering easiness were observed and evaluated in the same manner as in Example 1.

EXAMPLE 3

(I) Preparation of palladium coated barium titanate powder

To 700 ml. of palladium solution (consisting of 50 g. of palladium metal and 700 ml. of aqua regia) was added 120 g. of ammonium chloride (1.2 times in equivalent as much as the palladium) to obtain a gelling solution of orange color. By adding 450 ml. of aqueous ammonia (25% aqueous solution) to this solution, it changed into a pinkish gelling solution and the pH turned to about 7.

After adding 50 g. of barium titanate powder (average diameter: 1.5 μm) to this solution, 1000 ml. of aqueous sodium borohydride (0.75% by weight solution) was introduced thereinto under vigrous stirring to dissolve gelling state, resulting in precipitation of a black powder. The liquid phase was removed by decantation. The powder was then washed with water and hot water, ten times respectively by decantation, and dried at a temperature of 65° C. to obtain the desired palladium-coated barium titanate powder. The yield thereof was 99 g. (theoretical yield: 100 g.) and the weight ratio of barium titanate / palladium in the powder was 50/50.

(II) An internal electrode of laminated condenser

A mixture of the following composition including palladium-coated barium titanate powder obtained in the above (I) was prepared.

| Palladium-coated barium titanate powder | 45 g. |
|---|---|
| Ethylcellulose | 3.8 g. |
| Dibutyl phthalate | 3.8 g. |
| Butylcarbitol | 42.5 g. |

The mixture was sufficiently kneaded in a 3 roller type kneader to obtain an electroconductive paste.

A laminated condenser (35 layers, space between fired electrodes: 16 μm) was manufactured by the simultaneous firing process, using the above electroconductive paste and barium titanate elements (substrates).

The electric properties and structural properties of the so-prepared laminated condenser were measured. The results are shown in Table 3.

For comparison, the same measurements were carried out on a laminated condenser provided with a palladium (Pd) electrode produced by the same firing process as the above except for using the same amount of Pd powder as the amount of Pd-coated ceramic powder in place of Pd-coated powder. The results are also shown in Table 3.

TABLE 3

| Property | Pd-coated ceramic electrode | Pd electrode |
|---|---|---|
| Electric property | | |
| C | 239 nF | 234 nF |
| $\epsilon s$ | 9790 | 9600 |
| tan δ (%) | 0.58 | 0.51 |
| IR | $3.5 \times 10^{10}$ Ω | $3.5 \times 10^{10}$ Ω |
| $V_B$ | 620 V | 650 V |
| Temperature property (Δ C/C) | | |
| MAX. (%) | 11.2 | 18.0 |
| MIN. (%) | −72.0 | −73.1 |
| Tc (°C.) | 20 | 20 |
| Structural property | | |
| Delamination | 0 per 50 | 50 per 50 |
| Crack, Break | 0 per 50 | 2 per 50 |

Electrostatic capacity (C) and the dielectric dissipation factor (tan δ) were measured by the same method as in Example 1.

The insulation resistance (IR) was measured at 25 V after one minute by means of a YHP Insulating-Resistance Tester, model 4329A, and the breakdown voltage ($V_B$) was measured by means of a breakdown voltmeter of model NS-3150 (manufactured by Nisshin Electric Co., Ltd., Japan).

The temperature property (Δ C/C) was measured in the range from −25° C. to 85° C. The maximum and minimum values of the volume change ratio in the above range (standard temperature: 25° C.) are shown and a temperature showing the maximum value is described by Tc.

The delamination in the structural property was examined by polishing the element and observing them through a stereoscopic microscope (magnification: ×20), and the crack and break were examined by observing the appearance of elements through the same stereoscopic microscope.

EXAMPLE 4

(I) Preparation of molybdenum-coated aluminium oxide powder

A molybdenum-coated aluminium oxide powder was prepared in the same manner as in Example 3 except for using 2 l. of a molybdenum solution (50 g. of molybdenum metal in 2 l. of aqua regia) and 6 g. of aluminium oxide (average diameter: 1.5 μm) in place of the palladium solution and barium titanate powder, respectively. The yield was 98 g. (theoretical yield: 100 g.) and the weight ratio of aluminium oxide / molybdenum in the powder was 50/50.

(II) Multilayer interconnection element

A mixture of the following composition including the molybdenum-coated aluminium oxide powder obtained in the above (I) was prepared.

| | |
|---|---|
| Molybdenum-coated aluminium oxide | 45 g. |
| Ethylcellulose | 3.8 g. |
| Dibutyl phthalate | 3.8 g. |
| Butylcarbitol | 42.5 g. |

The mixture was sufficiently kneaded in a 3 roller type kneader to obtain an electroconductive paste.

A multilayer interconnection element (30 layers, thickness of a fired dielectric layer: 16 μm) was produced by the simultaneous firing process, using the electroconductive paste and aluminium oxide elements (substrates).

The electric and structural properties of the multilayer interconnection element were measured. The results are shown in Table 4.

For comparison, the same measurements were carried out on a multilayer interconnection element provided with the molybdenum (Mo) electrode produced by the same firing process as the above except for using the same amount of pure molybdenum metal powder as the amount of Mo-coated ceramic powder. The results are also shown in Table 4.

TABLE 4

| Property | Mo-coated ceramic electrode | Mo electrode |
|---|---|---|
| Electric property | | |
| C | 181.4 pF | 181.0 pF |
| $\epsilon s$ | 8.8 | 8.8 |
| R sq | 16 mΩ/sq | 16 mΩ/sq |
| Structural property | | |
| Delamination | 0 per 50 | 50 per 50 |

The electrostatic capacity (C) and the resistance in wiring (Rsq) were measured at a temperature of 25° C. by means of YHP degital LCR meter, Model 4274A under the conditions that the measuring voltage and measuring frequency were 1.0 $V_{rms}$−100 KHz, and 1.0 $V_{rms}$−100 Hz, respectively.

The delamination was examined by the microscopic observation in the same manner as in Example 3.

I claim:

1. An electronic component comprising a ceramic substrate having at least a portion of said substrate coated with a fired electroconductive precious metal-containing electrode layer,
said electrode layer having a surface thereof which consists essentially of said electroconductive precious metal, said electrode layer further comprising a plurality of micro-granular ceramic particles having an average diameter of not greater than 1 micron which particles have been coated with said electro-conductive precious metal and fired, said particles being in metal-to-metal contact whereby the surface portions of the outer surface layer of said fired particles form said surface of said electrode layer, said ceramic particle portion of said electrode layer consisting of from 90 to 10% by weight of said electrode layer.

2. The electronic component of claim 1 wherein said ceramic particle portion of said electrode layer comprises from 75 to 25% by weight of said electrode layer.

3. The electronic component of claim 1 wherein said micro-granular ceramic particles are metal oxide particles.

4. The electronic component of claim 1 wherein said micro-granular ceramic particles are titanium dioxide particles.

5. The electronic component of claim 1 wherein said micro-granular ceramic particles are barium titanate particles.

6. The electronic component of claim 1 wherein said precious metal is silver.

7. The electronic component of claim 1 wherein said precious metal is palladium.

8. The electronic component of claim 1 wherein said precious metal is gold.

9. An electronic component comprising a ceramic substrate having at least a portion of said substrate coated with a fired electroconductive air-stable metal-containing electarode layer, said electrode layer having a surface thereof which consist essentially of said electroconductive air-stable metal selected from the group consisting of platinum, gold, silver palladium, molybdenum, nickel, cobalt, iron, copper, zinc, tin, antimony, tungsten, manganese, tatanium, vanadium and chromium and an alloy thereof;

said electrode layer further comprising a plurality of micro-granular ceramic particles having an average diameter of not greater than 1 micron which particles have been coated with said electro-conductive precious metal and fired, said particles being in metal-to-metal contact whereby the surface portions of the outer surface layer of said fired particles from said surface of said electrode layer, said ceramic particle portion of said electrode layer consisting of from 90 to 10% by weight of said electrode layer and comprises a ceramic material selected from the group consisting of silicon dioxide, zirconium oxide, aluminum oxide, titanium dioxide, ferric oxide, calcium oxide, barium titanate, tungsten carbide, silicon carbide and titanium nitride.

10. The electronic component of claim 9 wherein said ceramic particle portion of said electrode layer comprises from 75 to 25% by weight of said electrode layer.

11. The electronic component of claim 9 wherein said ceramic material is an oxide.

12. The electronic component of claim 11 wherein said ceramic material is titanium dioxide.

13. The electronic component of claim 11 wherein said ceramic material is barium titanate.

14. The electronic component of claim 12 wherein the metal is silver or palladium.

15. The electronic component of claim 13 wherein the metal is silver of palladium.

16. The electronic component of claim 11 wherein the metal is copper or copper alloy.

17. The electronic component of claim 11 wherein the metal is gold.

* * * * *